US007259093B2

United States Patent
Hermes (10) Patent No.: US 7,259,093 B2
(45) Date of Patent: *Aug. 21, 2007

(54) METHODS OF FORMING A CONDUCTIVE CONTACT THROUGH A DIELECTRIC

(75) Inventor: Michael J. Hermes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/211,853

(22) Filed: Aug. 24, 2005

(65) Prior Publication Data

US 2006/0030145 A1 Feb. 9, 2006

Related U.S. Application Data

(63) Continuation of application No. 10/804,702, filed on Mar. 19, 2004, now Pat. No. 6,979,641.

(51) Int. Cl.
*H01L 21/4763* (2006.01)
(52) U.S. Cl. ................. 438/638; 257/E21.585
(58) Field of Classification Search ........ 257/E21.585; 438/638, 645, 739
See application file for complete search history.

(56) References Cited

U.S. PATENT DOCUMENTS

| 5,328,553 | A | * | 7/1994 | Poon ................ 438/633 |
| 5,439,848 | A | | 8/1995 | Hsu et al. |
| 5,516,710 | A | | 5/1996 | Boyd et al. |
| 5,518,948 | A | | 5/1996 | Walker |
| 5,891,799 | A | | 4/1999 | Tsui |
| 6,037,246 | A | | 3/2000 | Bhat et al. |
| 6,143,648 | A | | 11/2000 | Rodriguez et al. |
| 6,245,489 | B1 | | 6/2001 | Baklanov et al. |
| 6,245,663 | B1 | | 6/2001 | Zhao et al. |
| 6,294,314 | B1 | | 9/2001 | Liao |
| 6,979,641 | B2 | * | 12/2005 | Hermes ................ 438/638 |
| 2005/0079706 | A1 | | 4/2005 | Kumar et al. |

* cited by examiner

*Primary Examiner*—Asok Kumar Sarkar
(74) *Attorney, Agent, or Firm*—Wells St. John P.S.

(57) ABSTRACT

A dielectric is formed over a node location on a semiconductor substrate. The dielectric comprises an insulative material over the node location, an insulative polish stop layer over the insulative material, and an insulator layer over the insulative polish stop layer. A contact opening is formed into the insulator layer, the insulative polish stop layer and the insulative material to proximate the node location. A conductive material is deposited over the insulator layer and to within the contact opening. The conductive material and the insulator layer are polished to at least a portion of the insulative polish stop layer. In one implementation and prior to depositing the conductive material, at least a portion of the contact opening is widened with an etching chemistry that is selective to widen it within the insulative material to a degree greater than any widening of the contact opening within the insulative polish stop layer.

16 Claims, 5 Drawing Sheets

METHODS OF FORMING A CONDUCTIVE CONTACT THROUGH A DIELECTRIC

RELATED PATENT DATA

This patent resulted from a continuation application of U.S. patent application Ser. No. 10/804,702, filed Mar. 19, 2004, now U.S. Pat. No. 6,979,641 entitled "Methods of Forming a Conductive Contact Through a Dielectric", naming Michael J. Hermes as inventor, the disclosure of which is incorporated by reference.

TECHNICAL FIELD

This invention relates to methods of forming a conductive contact through a dielectric.

BACKGROUND OF THE INVENTION

In the fabrication of integrated circuitry, electrically conductive contacts are commonly made to electrically interconnect devices received at different elevations within a substrate. One technique for doing so forms a contact opening within insulative material to an underlying area within the substrate. The contact opening is then typically filled with an electrically conductive material which interconnects with or forms a part of an overlying device.

Figure 1:
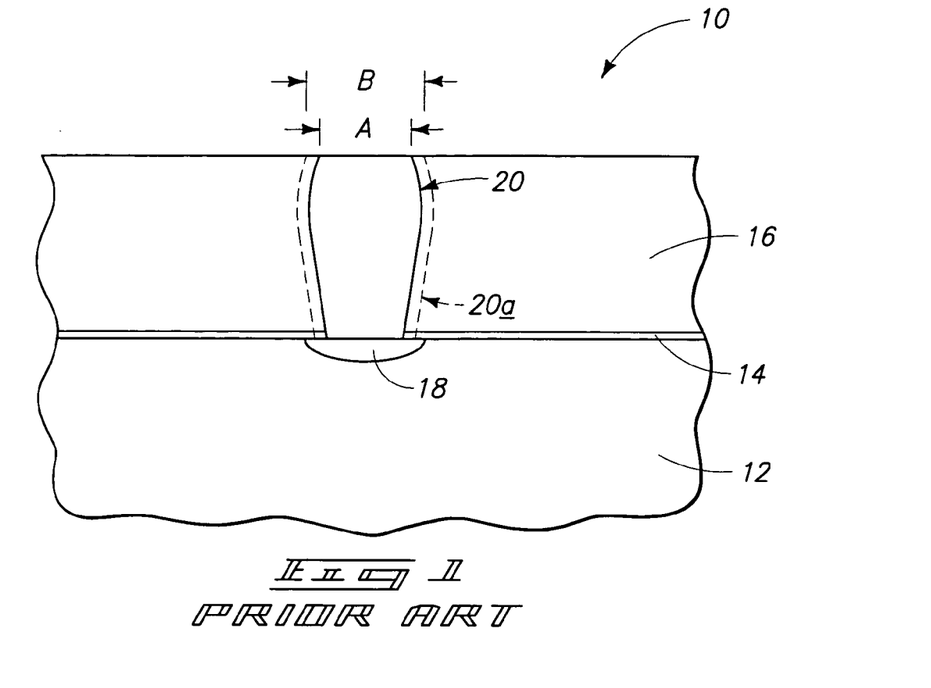
FIG. 1 is a diagrammatic depiction of a prior art semiconductor wafer fragment processed in accordance with prior art methods.

Exemplary prior art problems which motivated this invention are described with reference to FIG. 1. FIG. 1 depicts a semiconductor substrate 10 comprised of a bulk monocrystalline silicon substrate 12 having various layers formed thereover. The particular problem described is with respect to making a contact opening to a node location 18 within substrate 12, although the problem which motivated the invention manifests regardless of the underlying node location/area to which a conductive contact is being formed. For example, the conductive contact might be formed to any node location, whether comprised of semiconductive material, conductively doped semiconductive material, elemental metals, metal alloys, metal compounds, whether the node location is conductive or semiconductive at the time of the fabrication, etc. FIG. 1 depicts an updoped $SiO_2$ layer 14 received over monocrystalline silicon material 12. A doped $SiO_2$ layer 16, for example borophosphosilicate glass (BPSG), is formed over layer 14. A conductively doped diffusion region 18 has been fabricated within monocrystalline silicon material 12 and comprises a node location to which the conductive contact is being formed.

A contact opening 20 has been anisotropically etched through layers 16 and 14 to diffusion region 18. Ideally, such opening would have straight vertical sidewalls in the substrate orientation depicted in FIG. 1. However more typically a profile as depicted by solid lines 20 in FIG. 1 is a common result, whereby the opening widens slightly at the beginning of the etch and narrows towards the end of the etch. A maximum open width "A" is shown at the outermost portion of opening 20 at the conclusion of the etch.

A conductive material (not shown), for example comprising elemental tungsten, is deposited over layer 16 effective to fill opening 20. At this point in the process, such is typically then polished back, for example by chemical mechanical polishing, at least to the outer surface of layer 16, and typically slightly therebeyond to ensure the complete removal of all conductive material above layer 16.

However prior to deposition of the conductive material, the contact opening which was previously formed is typically subjected to one or more cleaning steps primarily for the purpose of providing a clean, exposed surface on the depicted node location 18. The anisotropic etching depicted to produce FIG. 1, as well as exposure of the substrate to subsequent atmospheres, can leave or form a thin oxide layer over diffusion region 18. This is typically cleared by a suitable liquid etching chemistry prior to deposition of the conductive material to assure electrical contact of the same with diffusion region 18. For example, all of layer 14 might not be cleared by the anisotropic etching depicted to form contact opening 20, and/or a native oxide might form over diffusion region 18. By way of example only, any such oxide can be cleared with a suitable etching chemistry, for example dipping or spraying the substrate with an HF chemistry.

Unfortunately, the typical wet oxide cleans have a tendency to widen the contact opening, for example as depicted by the outline of dashed lines 20a. Further, such widening is not as precisely controllable as one would prefer. Accordingly, the outermost portion of the contact opening can be widened from initial dimension "A" to a subsequent wider dimension "B". Further because of the typical contact opening profile depicted in FIG. 1, a typical over-polish of the subsequently deposited conductive material will also go into layer 16 to some degree which is also not precisely controllable. As the initially etched contact opening profile widens to some degree in going from the outermost surface of layer 16 to elevationally inward at least initially, this further contributes to uncontrolled widening of contact opening 20/20a.

Integrated circuitry fabrication continues to strive to make ever denser circuitry devices and components such that the conductive contacts are continually placed closer and closer together. Accordingly, it is desirable to precisely control the maximum width of the conductive contacts to facilitate controlling the critical dimension between immediately adjacent contacts. The lack of contact width control due to contact widening from the clean etching chemistries and over-polishing of material 16 to form the contacts is counter to the dimension control of individual contacts and accordingly to control of the critical dimension between adjacent contacts.

While the invention was motivated in addressing and improving on the above-described issues, it is in no way so limited. Rather, the invention is limited only by the accompanying claims as literally worded, without limiting reference to the drawings or specification or problem(s) as just described, and in accordance with the doctrine of equivalents.

SUMMARY

The invention includes methods of forming conductive contacts through a dielectric. In one implementation, a dielectric is formed over a node location on a semiconductor substrate. The dielectric comprises an insulative material over the node location, an insulative polish stop layer over the insulative material, and an insulator layer over the insulative polish stop layer. A contact opening is formed into the insulator layer, the insulative polish stop layer and the insulative material to proximate the node location. A conductive material is deposited over the insulator layer and to within the contact opening. The conductive material and the insulator layer are polished to at least a portion of the insulative polish stop layer. In one implementation and prior to depositing the conductive material, at least a portion of the contact opening is widened with an etching chemistry that is selective to widen the contact opening within the insulative material to a degree greater than any widening of the contact opening within the insulative polish stop layer.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 2:
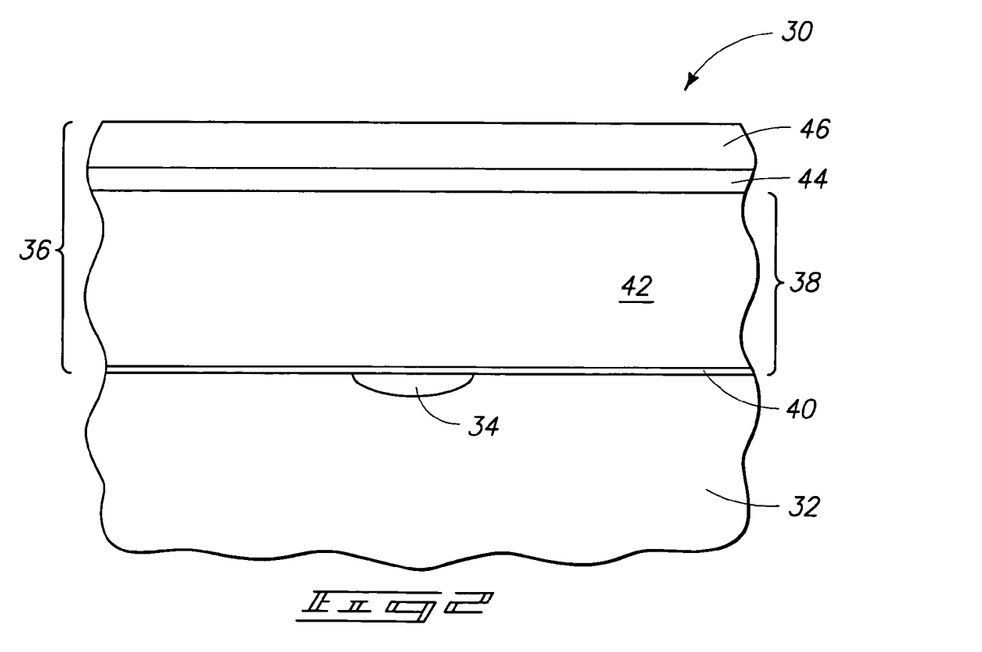
FIG. 2 is a depiction of a semiconductor wafer fragment at a processing in accordance with an aspect of the invention.

A first preferred embodiment of a method of forming a conductive contact through a dielectric in accordance with an aspect of the invention is described with reference to FIGS. 2-7. Referring initially to FIG. 2, a semiconductor substrate is indicated generally with reference numeral 30. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" encompasses both the singular and the plural unless otherwise indicated. Substrate 30 comprises a bulk monocrystalline silicon substrate 32 having a conductive diffusion region 34 formed therein. Diffusion region 34 comprises a node location to which a conductive contact will be formed in accordance with one aspect of the invention. Of course, alternate substrates and node locations are contemplated to which a conductive contact is to be made in accordance with the above background section description of node locations.

A dielectric 36 is formed over node location 34. In the depicted embodiment, such comprises an insulative material 38 which in one preferred embodiment predominately comprises $SiO_2$, and more preferably predominately comprises doped $SiO_2$. In the context of this document, "doped" means having at least 3% by weight of boron, phosphorus, or boron and phosphorus concentration in the stated material or layer. "Undoped" means having less than 3% by weight of boron, phosphorus, or boron and phosphorus concentration in the stated material or layer. Also in the context of this document, "predominately" is used in its ordinary sense to mean greater than 50%. FIG. 2 depicts insulative material 38 as comprising an undoped $SiO_2$ layer 40 having a doped $SiO_2$ layer 42 formed over (and preferably "on" as shown) undoped $SiO_2$ layer 40. An exemplary preferred thickness range for insulative material 38 is from about 15,000 Angstroms to about 25,000 Angstroms, with an exemplary thickness for undoped $SiO_2$ layer 40 being from about 50 Angstroms to about 1500 Angstroms. An exemplary manner of forming layer 40 is by chemical vapor deposition involving the decomposition of tetraethylorthosilicate. An exemplary preferred material for depicted layer 42 is BPSG. By way of example only, alternate exemplary materials 42 are doped or undoped spin-on glass, as well as borosilicate glass or phosphosilicate glass. Further in one embodiment, insulative material 38 consists essentially of doped $SiO_2$ and undoped $SiO_2$.

Dielectric 36 comprises an insulative polish stop layer 44 received over (and preferably "on", as shown) insulative material 38. Such will provide an effective polish stopping function, as will be apparent subsequently, relative to polishing of materials lying thereover. By way of example only and in preferred embodiments, exemplary materials for layer 44 include undoped $SiO_2$, silicon nitride, or a combination thereof. In one preferred embodiment, layer 44 consists essentially of silicon nitride. Further by way of example only, additional materials for layer 44 include insulative metal oxides, for example at least one of tantalum oxide, aluminum oxide and hafnium oxide, including mixtures thereof. Further in one preferred embodiment, and by way of example only, insulative polish stop layer 44 has a thickness from about 500 Angstroms to about 2,000 Angstroms, and in one preferred embodiment is substantially homogeneous. In one preferred embodiment, insulative polish stop layer 44 comprises undoped $SiO_2$, and at least outermost portion of insulative material 38 comprises doped $SiO_2$.

Dielectric 36 includes an insulator layer 46 received over (and preferably "on", as shown) insulative polish stop layer 44. In one exemplary embodiment, those portions of insulator layer 46 and insulative material 38 which contact insulative polish stop layer 44 (where any contacting occurs) constitute the same composition material. In one exemplary embodiment those portions of insulator layer 46 and insulative material 38 which contact insulative polish stop layer 44 (where any contacting occurs) constitute different composition materials. By way of example only, exemplary materials for insulator layer 46 include $SiO_2$, whether doped or undoped. Doped silicon dioxide is more preferred. In the context of this document, doped and updoped $SiO_2$ are considered to constitute different composition materials. Further by way of example only, an exemplary material for insulator layer 46 is amorphous carbon. An exemplary preferred thickness range for insulator layer 46 is from about 1,000 Angstroms to about 3,000 Angstroms, with insulator layer 46, in one preferred embodiment, being substantially homogeneous.

Figure 3:
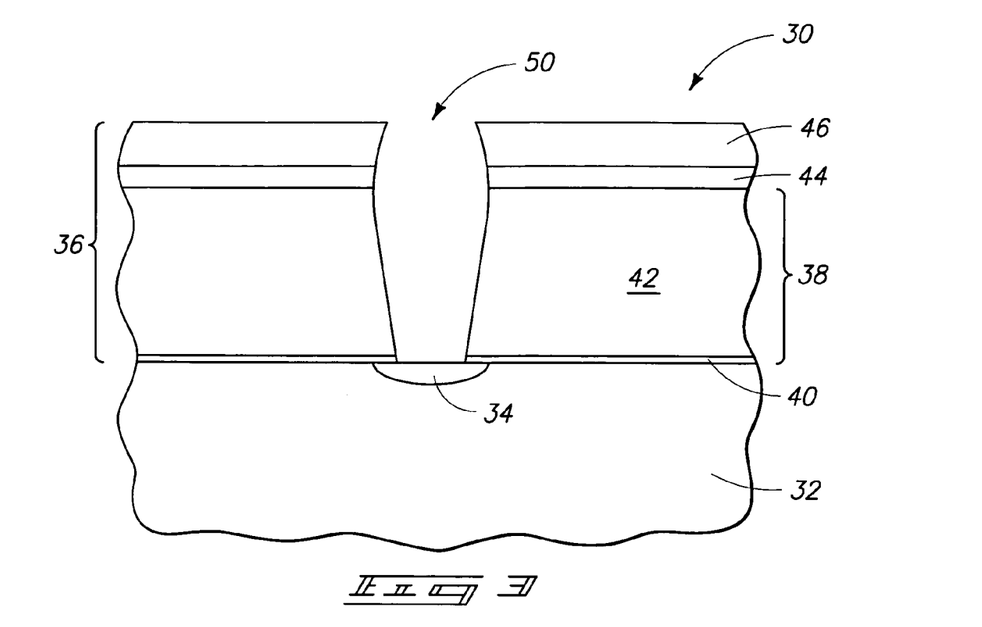
FIG. 3 is a view of the FIG. 2 wafer at a processing subsequent to that depicted by FIG. 2.

Referring to FIG. 3, a contact opening 50 is formed into insulator layer 46, insulative polish stop layer 44, and insulative material 38 to proximate node location 34. Accordingly, node location 34 may or may not be exposed in the initial forming of contact opening 50. Regardless, contact opening 50 can be fabricated by any existing or yet-to-be developed methods. Further of course, multiple such contact openings would typically be fabricated essentially simultaneously over the substrate. By way of example only, an existing exemplary technique includes photolithography and etch whereby a layer of photoresist is deposited and patterned to form openings therethrough and which is used as a mask for etching correspondingly patterned openings 50 into substrate 30.

Figure 4:
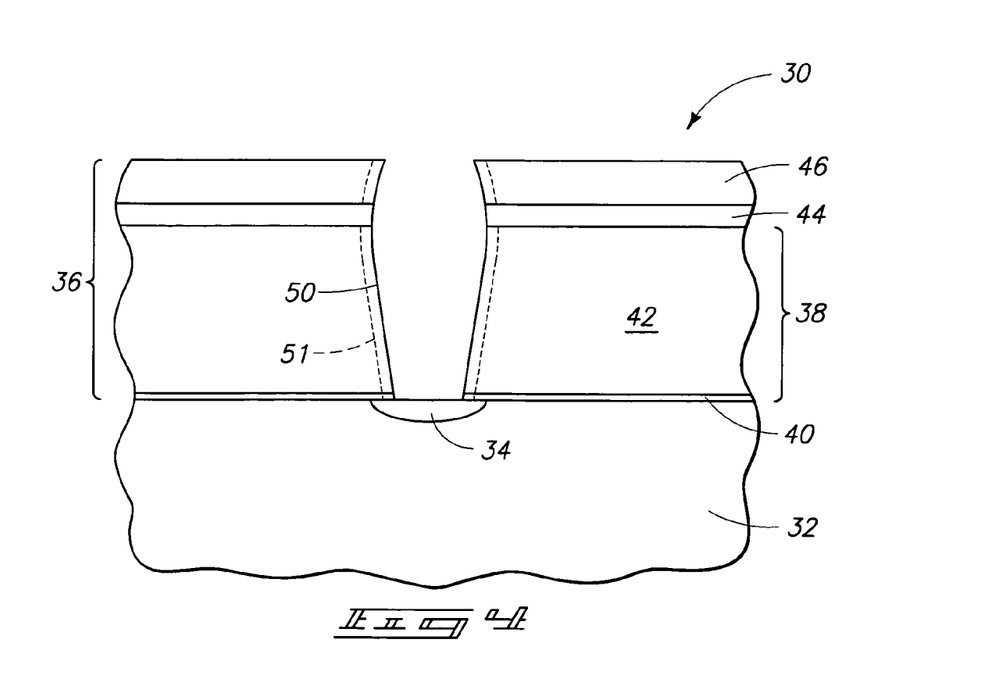
FIG. 4 is another view of the FIG. 3 wafer fragment.
Figure 5:
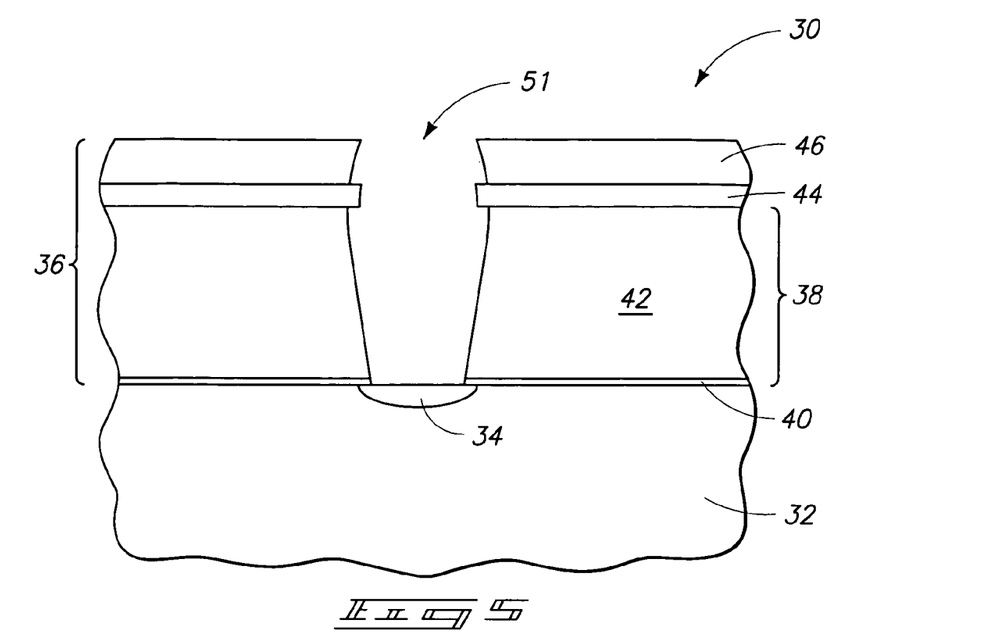
FIG. 5 is a view of the FIG. 3 wafer fragment at a processing subsequent to that depicted by FIG. 3.

Referring to FIGS. 4 and 5, at least a portion of contact opening 50 is widened into a contact opening 51 with an etching chemistry that is selective to widen contact opening 50 within insulative material 38 to a degree greater than any widening which occurs to contact opening 50 within insulative polish stop layer 44. For purposes of illustration and by way of example only, FIG. 4 depicts the exemplary respective outlines of original contact opening 50 and what will be widened contact opening 51. In the depicted preferred embodiment, the widening is also depicted as widening contact opening 50 within insulator layer 46. In one preferred embodiment, the widening is selective to widen the contact opening within the insulative material to a degree that is at least two times greater than any widening of the contact opening within the insulative polish stop layer, and more preferably much greater than this, for example at least fifty times greater than any widening of the contact opening within the insulative polish stop layer. Where, for example, materials 46 and 42 comprise doped $SiO_2$, and material 44 comprises silicon nitride or undoped $SiO_2$, an exemplary etching chemistry is an aqueous liquid such as dilute HF, a combination of ammonium fluoride and phosphoric acid, or a combination of isopropyl alcohol, ammonium fluoride and dilute HF. Etching with such can be by either spray or bath dip at an exemplary temperature of 20° C. to 40° C. for from about 1 minute to 45 minutes to produce the illustrated effect, as well as clear any native oxide or other material from over node location 34. Selectivity of doped oxide to undoped oxide in such instance is typically from about 2:1 to 5:1, while that for doped oxide to $Si_3N_4$ is about 200:1.

Figure 6:
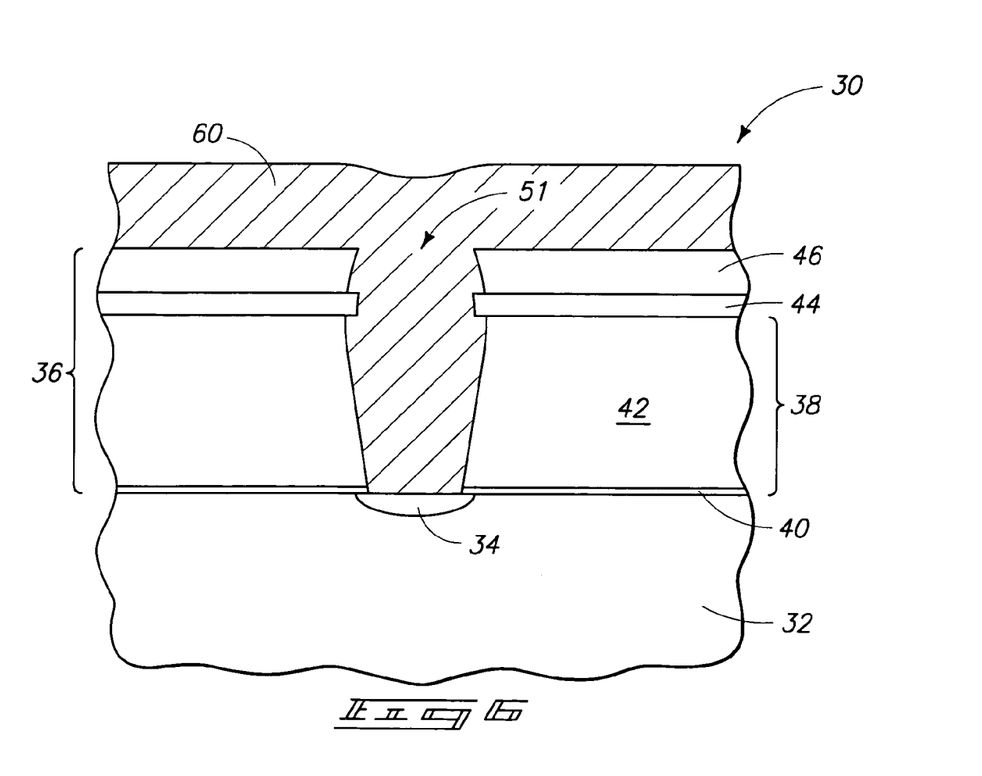
FIG. 6 is a view of the FIG. 5 wafer fragment at a processing subsequent to that depicted by FIG. 5.

Referring to FIG. 6 and after the widening, conductive material 60 is deposited over insulator layer 46 and to within contact opening 50/51. In the preferred embodiment as shown, conductive material 60 fills contact opening 50/51. Such might comprise conductively doped semiconductive material, an elemental metal, an alloy of elemental metals, a conductive metal compound, or combinations thereof. An exemplary preferred material is elemental tungsten. Glue or diffusion barrier layers of, for example, tungsten nitride and/or titanium nitride might, by way of example, initially be deposited to comprise an inner portion of conductive material 60.

Figure 7:
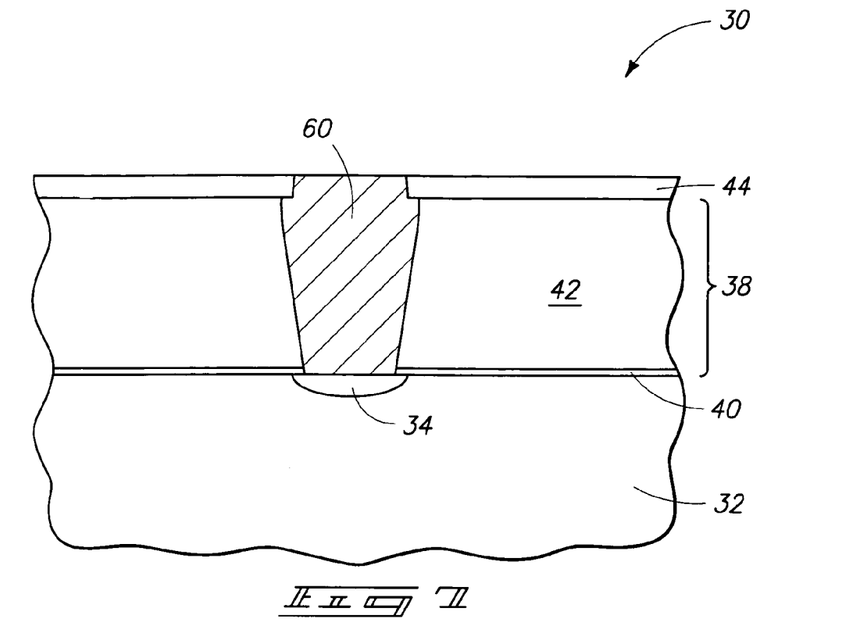
FIG. 7 is a view of the FIG. 6 wafer fragment at a processing subsequent to that depicted by FIG. 6.

Referring to FIG. 7, conductive material 60 and insulator layer 46 have been polished to at least a portion of insulative polish stop layer 44. In the context of this document, "polishing" requires at least some mechanical action with some sort of abrading polishing device, for example a polishing pad, whether existing or yet-to-be developed. By way of example only, one exemplary existing preferred technique comprises chemical mechanical polishing. Further by way of example only, where conductive material 60 comprises one or more of elemental tungsten and metal compounds, insulator layer 46 comprises doped $SiO_2$, and insulative polish stop layer 44 comprises silicon nitride or undoped $SiO_2$, an exemplary chemical mechanical polishing slurry includes cerium oxide and a surfactant in an approximately pH neutral polishing liquid. Insulative polish stop layer 44 comprises some material which will polish at a slower rate than that of insulator layer 46 such that a polish stopping effect can be achieved, Of course, some/much of insulative polish stop layer 44 might be removed in the process in providing such stopping effect.

Figure 8:
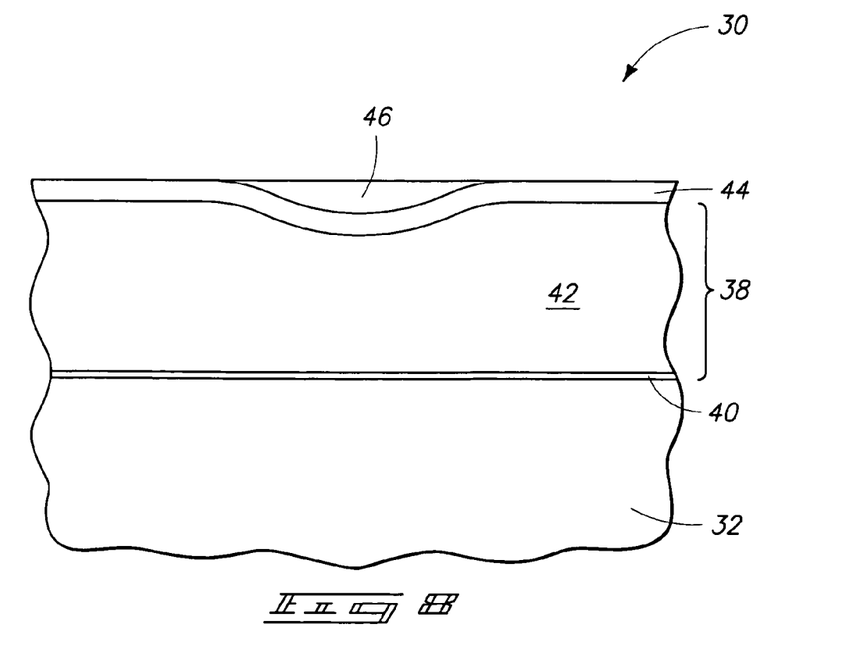
FIG. 8 is a depiction of a portion of the FIG. 7 substrate different from that of FIG. 7.

FIGS. 2-7 depict one exemplary embodiment whereby the depicted outermost surfaces of the substrates in the processing to form FIG. 7 are substantially planar. However, such is of course not a requirement. Further, other portions of the substrate might not be entirely planar, by way of example only, such as depicted in FIG. 8. FIG. 8 depicts an area of substrate 30 which is not planar such that a dip occurs in the relative layers, with some of insulator layer 46 still being received within the dip after the stated polishing.

The above described exemplary processing might provide for better contact dimension control in part by better control of the outermost dimensions of the ultimate contact by both better defining a polish stop and in restricting contact opening widening of the outermost portion of the contact.

Figure 9:
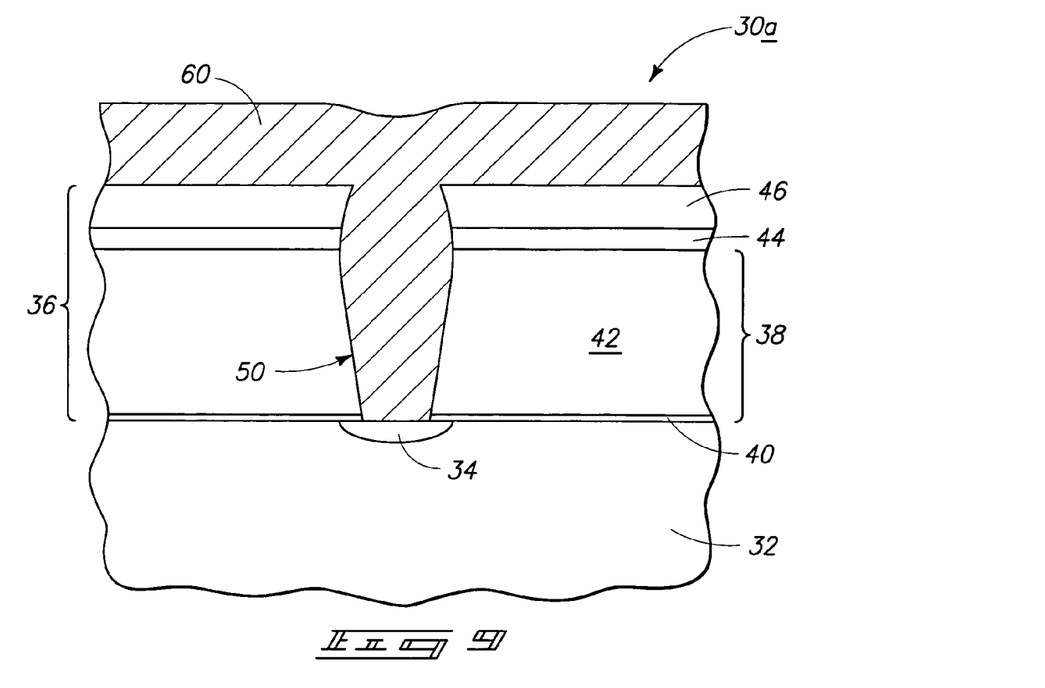
FIG. 9 is an alternate processing of a wafer fragment subsequent to that depicted by FIG. 3.

While the preferred embodiment is as described above and might address the background described problems, the invention also contemplates a method of forming a conductive contact through a dielectric independent of whether contact opening widening occurs. By way of, example only, such an exemplary process is described with reference to FIGS. 9 and 10. Like numerals from the first described embodiment are utilized where appropriate, with differences being indicated with the suffix "a". Referring initially to FIG. 9, a semiconductor wafer fragment 30a includes dielectric 36 having contact opening 50 formed therein as essentially is also depicted in FIG. 3. However here, conductive material 60 has been formed over insulator layer 46 to within contact opening 50 without any widening effect of any portion of contact opening 50 having occurred.

Figure 10:
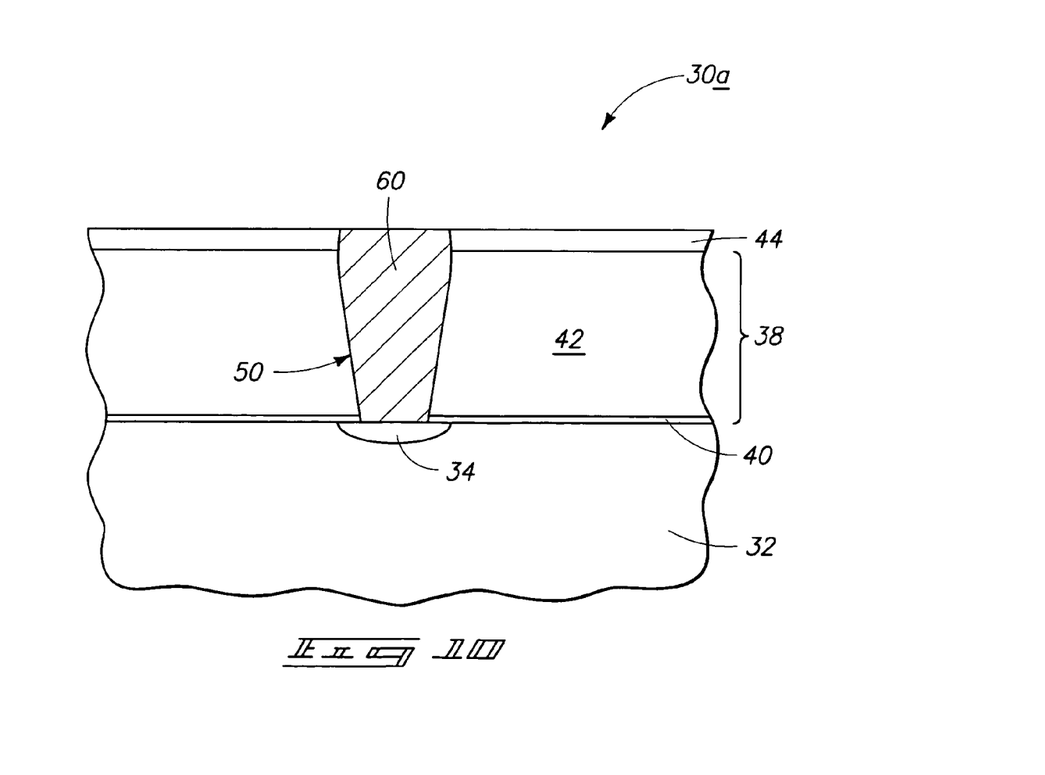
FIG. 10 is a view of the FIG. 9 wafer fragment at a processing subsequent to that depicted by FIG. 9.

Referring to FIG. 10, conductive material 60 and insulator layer 46 have been polished to at least a portion of insulative polish stop layer 44.

In one aspect, the invention encompasses a method of forming a conductive contact through a dielectric. Such includes forming a dielectric over a node location on a semiconductor substrate. The dielectric comprises an insulative material over the node location, an insulative polish stop layer over the insulative material, and an insulator layer over the insulative polish stop layer. A contact opening is formed into the insulator layer, the insulative polish stop layer and the insulative material to proximate the node location. Conductive material is deposited over the insulative layer and to within the contact opening. The conductive material and the insulator layer are polished to at least a portion of the insulative polish stop layer. Other preferred attributes are as described above with respect to such method.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a conductive contact through a dielectric, comprising:
    forming a dielectric over a node location on a semiconductor substrate; the dielectric comprising an insulative material over the node location, an insulative polish stop layer over the insulative material, and an insulator layer over the insulative polish stop layer; the insulative polish stop layer comprising an insulative metal oxide comprising at least one of tantalum oxide, aluminum oxide and hafnium oxide, including mixtures thereof;

forming a contact opening into the insulator layer, the insulative polish stop layer and the insulative material to proximate the node location;

widening at least a portion of the contact opening with an etching chemistry that is selective to widen the contact opening within the insulative material to a degree greater than any widening of the contact opening within the insulative polish stop layer;

after the widening, depositing conductive material over the insulator layer and to within the contact opening; and polishing the conductive material and the insulator layer to at least a portion of the insulative polish stop layer such that some portion of the insulative metal oxide of the polish stop layer remains after stopping the polishing.

2. The method of claim 1 wherein the insulative polish stop layer is formed on the insulative material, and the insulator layer is formed on the insulative polish stop layer.

3. The method of claim 2 wherein those portions of the insulator layer and the insulative material which contact the insulative polish stop layer constitute the same composition material.

4. The method of claim 2 wherein those portions of the insulator layer and the insulative material which contact the insulative polish stop layer constitute different composition materials.

5. The method of claim 1 wherein
the insulative material has a thickness from about 15,000 Angstroms to about 25,000 Angstroms;
the insulative polish stop layer is received on the insulative material, is substantially homogeneous, and has a thickness from about 500 Angstroms to about 2,000 Angstroms; and
the insulator layer is received on the insulative polish stop layer, is substantially homogeneous, and has a thickness from about 1,000 Angstroms to about 3,000 Angstroms.

6. A method of forming a conductive contact through a dielectric, comprising:

forming a dielectric over a node location on a semiconductor substrate; the dielectric comprising an insulative material over the node location, an insulative polish stop layer on the insulative material, and an insulator layer on the insulative polish stop layer, wherein those portions of the insulator layer and the insulative material which contact the insulative polish stop layer constitute the same composition material;

forming a contact opening into the insulator layer, the insulative polish stop layer and the insulative material to proximate the node location;

widening at least a portion of the contact opening with an etching chemistry that is selective to widen the contact opening within the insulative material to a degree greater than any widening of the contact opening within the insulative polish stop layer;

after the widening, depositing conductive material over the insulator layer and to within the contact opening; and polishing the conductive material and the insulator layer to at least a portion of the insulative polish stop layer such that some portion of the insulative polish stop layer remains after stopping the polishing.

7. A method of forming a conductive contact through a dielectric, comprising:

forming a dielectric over a node location on a semiconductor substrate; the dielectric comprising an insulative material over the node location, an insulative polish stop layer over the insulative material, and an insulator layer over the insulative polish stop layer; the insulative polish stop layer comprising undoped $SiO_2$ and an outermost portion of the insulative material comprising doped $SiO_2$;

forming a contact opening into the insulator layer, the insulative polish stop layer and the insulative material to proximate the node location;

widening at least a portion of the contact opening with an etching chemistry that is selective to widen the contact opening within the insulative material to a degree greater than any widening of the contact opening within the insulative polish stop layer;

after the widening, depositing conductive material over the insulator layer and to within the contact opening; and polishing the conductive material and the insulator layer to at least a portion of the insulative polish stop layer such that some portion of the undoped SiO2 of the polish stop layer remains after stopping the polishing.

8. The method of claim 7 wherein the insulative polish stop layer is formed on the insulative material, and the insulator layer is formed on the insulative polish stop layer.

9. The method of claim 8 wherein those portions of the insulator layer and the insulative material which contact the insulative polish stop layer constitute the same composition material.

10. The method of claim 8 wherein those portions of the insulator layer and the insulative material which contact the insulative polish stop layer constitute different composition materials.

11. The method of claim 7 wherein,
the insulative material has a thickness from about 15,000 Angstroms to about 25,000 Angstroms;
the insulative polish stop layer is received on the insulative material, is substantially homogeneous, and has a thickness from about 500 Angstroms to about 2,000 Angstroms; and
the insulator layer is received on the insulative polish stop layer, is substantially homogeneous, and has a thickness from about 1,000 Angstroms to about 3,000 Angstroms.

12. A method of forming a conductive contact through a dielectric, comprising:

forming a dielectric over a node location on a semiconductor substrate; the dielectric comprising an insulative material over the node location, an insulative polish stop layer over the insulative material, and an insulator layer over the insulative polish stop layer; the insulative material predominately comprising doped $SiO_2$; the insulative polish stop layer predominately comprising undoped $SiO_2$, $Si_3N_4$ or a combination thereof; the insulator layer predominately comprising doped $SiO_2$;

forming a contact opening into the insulator layer, the insulative polish stop layer and the insulative material to proximate the node location;

widening at least a portion of the contact opening with an etching chemistry that is selective to widen the contact opening within the insulative material to a degree greater than any widening of the contact opening within the insulative polish stop layer;

after the widening, depositing conductive material over the insulator layer and to within the contact opening effective to fill the contact opening; and chemical mechanical polishing the conductive material and the insulator layer to at least a portion of said insulative polish stop layer such that some portion of said insulative polish stop layer remains after stopping the polishing.

13. The method of claim 12 wherein the insulative polish stop layer is formed on the insulative material, and the insulator layer is formed on the insulative polish stop layer.

14. The method of claim 13 wherein those portions of the insulator layer and the insulative material which contact the insulative polish stop layer constitute the same composition material.

15. The method of claim 13 wherein those portions of the insulator layer and the insulative material which contact the insulative polish stop layer constitute different composition materials.

16. The method of claim 12 wherein, the insulative material has a thickness from about 15,000 Angstroms to about 25,000 Angstroms;

the insulative polish stop layer is received on the insulative material, is substantially homogeneous, and has a thickness from about 500 Angstroms to about 2,000 Angstroms; and the insulator layer is received on the insulative polish stop layer, is substantially homogeneous, and has a thickness from about 1,000 Angstroms to about 3,000 Angstroms.

* * * * *